United States Patent [19]
Amerasekera et al.

[11] Patent Number: 5,930,094
[45] Date of Patent: Jul. 27, 1999

[54] CASCODED-MOS ESD PROTECTION CIRCUITS FOR MIXED VOLTAGE CHIPS

[75] Inventors: E. Ajith Amerasekera, Plano, Tex.; Raoul B. Salem, Redwood City, Calif.

[73] Assignee: Texas Instruments Incorporated, Dallas, Tex.

[21] Appl. No.: 09/140,051

[22] Filed: Aug. 26, 1998

Related U.S. Application Data

[60] Provisional application No. 60/057,273, Aug. 29, 1997.

[51] Int. Cl.$^6$ ........................................................ H02H 9/04
[52] U.S. Cl. ................................ 361/56; 361/111; 361/91; 327/310
[58] Field of Search ................................ 361/56, 91, 111; 327/310, 313, 327

[56] References Cited

U.S. PATENT DOCUMENTS

| | | | |
|---|---|---|---|
| 5,473,500 | 12/1995 | Payne et al. | 361/111 |
| 5,852,375 | 12/1998 | Byrne et al. | 361/56 |
| 5,852,540 | 12/1998 | Haider | 361/56 |

OTHER PUBLICATIONS

Proceedings of the IEEE, vol. 81, No. 5, May 1993, "ESD: A Pervasive Reliability Convern for IC Technologies," pp. 690–702 (Charvaka Duvvury, Member IEEE and Ajith Amerasekera, Member IEEE).

1995 IEEE, "EOS/ESD Reliability of Deep Sub–Micron NMOS Protection Devices," pp. 284–291 (Sridhar Ramaswamy, Charvaka duvvury and Sung–Mo Kang).

*Primary Examiner*—Sally C. Medley
*Attorney, Agent, or Firm*—Jacqueline J. Garner; Carlton H. Hoel; Richard L. Donaldson

[57] ABSTRACT

Bias circuits which define control terminal voltages in a cascoded nMOS ESD protection circuit, such that the circuit is in high impedance state (OFF) during normal operation, and low impedance (ON) during an ESD event. G1 and G2 are the driver circuits which define V3 and V4 during an ESD event at the pad. During normal operation, V3 and/or V4 are high and no current flows between the pad and $V_{SS}$. During an ESD event, V3 and V4 are high and both devices conduct MOS current as the lateral NPNs turn on. Diode D1 conducts current to charge $C_c$, the chip capacitance, raising $V_{DD}$, enabling G1 and G2 to turn on and raise V3 and V4 to levels greater than the nMOS threshold voltage.

5 Claims, 5 Drawing Sheets

CASCODED-MOS ESD PROTECTION CIRCUITS FOR MIXED VOLTAGE CHIPS

BACKGROUND AND SUMMARY OF THE INVENTION

This application claims priority under 35 USC §119(e)(1) of provisional application number 60/057,273, filed Aug. 29, 1997.

The present invention discloses techniques for enhancing Electrostatic Discharge ("ESD") protection in high density mixed-voltage integrated circuits.

Background: Vulnerability to Electrostatic Discharge (ESD)

Modern integrated circuits (ICs) are easily damaged by excess voltages, and one common source of such potentially damaging voltages is caused when two materials are rubbed together. A person can develop very high static voltage, from a few hundred to several thousand volts, simply by walking across a room or by removing an IC from its plastic package, even when careful handling procedures are followed.

A longstanding problem is that if such a high voltage is accidentally applied to the pins of an IC package, the discharge can cause gate oxide breakdown of the devices to which it is applied. The breakdown may cause immediate destruction of the device, or (more insidiously) it may weaken the oxide enough to cause later device failure after the chip has been placed in service in the field.

In MOS integrated circuits, all pins are provided with protection circuits to prevent voltages from damaging the MOS gates. (The term "MOS" is used in this application, as is now conventional, to refer to any insulated-gate-field-effect-transistor, or to integrated circuits which include such transistors.) These protection circuits are designed to begin conducting to ground (or to the power-supply rail) when excess voltage occurs. However, such protection devices must begin conducting enough current soon enough that the voltage does not rise to levels which would damage the gate oxides of the chip's MOS transistors. The required high current conduction is usually achieved by designing the protection device to go into avalanche breakdown. (A "breakdown" mode of operation is a mode where high current is passed for as long as the applied voltage remains above a certain value.) Since the breakdown mechanism of the protection circuit is designed to be nondestructive, the protection circuits provide a normally open path that closes only when the high voltage appears at the input or output terminals.

However, technological advances are leading to the creation of smaller and faster components that are increasingly more fragile. The output stages of MOS circuits which, until now, have been capable of withstanding high discharge currents, are becoming more vulnerable. In particular, the advantages of the various techniques for improving the performance characteristics of integrated circuits are offset by increased sensitivity to over-voltages or discharges. Breakdown voltages of the junctions or punch-through voltages between drain and source of the MOS transistors are becoming lower and the gate oxide more fragile. Such techniques as thinning of the gate oxide layers, the reduction in width of the conduction channels of the transistor or the very low doping and small thickness of the drain regions of transistors are forcing circuit designers to focus more attention to protection as transient voltages have a greater impact due to advances in IC fabrication. (Flow of large currents may lead to generation of hot carriers, which can become trapped in the gate oxide and produce a long-term shift in the characteristics of the device.)

More aggressive manufacturers have developed 4 kV ESD-robust ICs, even for advanced circuits in state-of-the-art technologies, creating a target level which other manufacturers are urged to match. (A 4 kV ESD-robust IC is one which can withstand a 4000 Volt transient.) There is good reason for this. US military specifications require that all products with less than 4 kV ESD thresholds must be labeled ESD sensitive and must be subjected to special handling procedures and restrictions which may add to the cost of manufacturing. Many commercial specifications have similar standards.

There is evidence that products with ESD thresholds of <2 kV are prone to higher yield loss (fallout) during assembly, packaging, and handling, leading to lower product yields. In the manufacture of large advanced ICs, the product yield can be as low as 30% to 50%. A further 10% fallout due to electrical failure is costly to the IC manufacturer. Fallout decreases as ESD threshold levels are increased to 4 kV. Increasing the ESD threshold beyond 4 kV does not significantly decrease fallout. Therefore, the additional cost expended to exceed the 4 kV threshold is not worthwhile for ICs used in computers or telecommunications applications, which is the major share of the market for state-of-the-art ICs.

ESD damage due to handling and testing can have a significant influence on product yield. Large ICs manufactured in advanced processes may only have 30 to 40 chips per six inch wafer. Any product loss due to ESD damage has a direct impact on profitability, and even fall-outs of the order of 1% are not acceptable. Another issue which gives increasing importance to ESD control is the move towards replaceable ICs in electronic systems. Instead of replacing the whole circuit board, as used to be the standard practice, users are now encouraged to purchase upgrades to their microprocessors and memory cards and perform the installation themselves. Since the installation does not necessarily take place in an ESD-safe environment, the ICs need to be ESD-robust.

With normal large chips, the greatest risk of ESD-induced damage occurs when the chip is being handled, not when it is socketed. ESD protection is therefore normally tested with the supply voltage either grounded or totally disconnected.

Background: Mixed-Voltage Circuits

A feature of state-of-the-art ICs is the requirement for mixed voltages within the IC structure. (For example, a chip which operates with signals ranging from 0 Volts to 3.3 Volts may have an internal supply voltage of only 2.5 Volts. Level shifters and buffers provide translation from the higher-voltage outside world to the lower-voltage operation in the interior of the chip.) This permits the devices in the interior of the chip to be scaled down and optimized for the lower supply voltage.

Formerly, thick oxide devices or field oxide devices ("FOD") were used, e.g. with feature sizes of 1–3 microns. However, FOD performance is limited in circumstances using lightly doped drain junctions, and the onset of damage has been observed at between 1 kV and 2 kV. However, in the submicron regimes of advanced CMOS processes, nMOS devices are replacing FODs as primary ESD protection devices. In the deep submicron range (below 0.5 micron) the thin oxide device actually gives a much better performance. In those applications where thin oxide devices are used for protection, the device gate is usually grounded. This will always ensure that the protection device, while being effective for ESD protection, will not cause any extra leakage at the pin.

However, the combination of mixed voltage operation with thin oxide protection devices presents a problem for ESD protection. The problem is that mixed voltage input/output circuits need to be able to sustain voltages which may be in excess of the gate oxide reliability requirements. (For example, a gate oxide thickness which is fully optimized for operation from a 2.5 V supply may not reliably withstand exposure to a 3.3 V+10% gate-to-source potential.) Hence, protection circuits cannot use transistors with thin gate oxides connected to the pad in configurations which the gate oxide is subjected to excessive electric fields.

Some fabrication processes provide both high-voltage and low-votlage transistors. In such processes the high-voltage transistors, which have thicker gate oxides, can be used for the protection circuits. However, most processes (single-gate-oxide processes) do not have this capability. Thus there is a need for an ESD protection circuit which can use thin-oxide MOS devices which have the same oxide thickness as those used in the interior of the chip.

Further background on device structures for protecting integrated circuits against electrostatic discharge can be found in, e.g., Duvvury et al., "ESD: a pervasive reliability concern for IC technologies," 81 PROC. IEEE 690 (1993), Amerasekera and Duvvury, ESD IN SILICON INTEGRATED CIRCUITS (1995); Ramaswamy et al., "EOS/ESD Reliability of Deep Sub-Micron NMOS Protection Devices", International Reliability Physics Symposium (IRPS) (1995). These publications, and the references cited therein, are incorporated by reference.

Innovative ESD Protection Architecture

In mixed-supply voltage technology, the present application teaches that it is preferable to use cascoded thin-oxide MOS devices. Moreover, in preferred embodiments the thin oxide devices are made more effective by biasing their gates high during an ESD event. Thus the gate voltages are important to the turn-on of the circuit and its effective operation, together with the efficiency of the lateral NPN transistor.

An advantage of the disclosed methods and structures include a circuit which has shown greater than 4 kV ESD protection capability in a 0.3 micron CMOS technology.

Another advantage of the disclosed method and structures is an ESD protection circuit compatible with mixed-voltage design requirements.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 2:
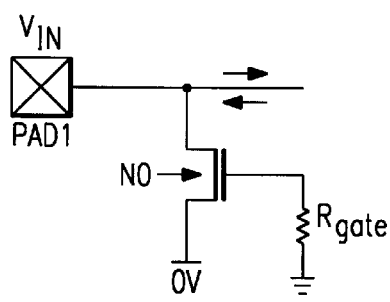
FIG. 2 shows a single gate oxide protection circuit connected to a pad.

Prior art FIG. 2 shows a single-transistor protection circuit connected to a pad PAD1. In this configuration the normal maximum voltage $V_{in}$ on the pad PAD1 cannot greatly exceed the supply voltage VDD for which the transistor N0 is optimized. This presents difficulties in a mixed-voltage chip, since if the transistor is optimized for the lower internal supply voltage it may be unreliable when connected to the higher voltages present at the external pad.

MOS transistors designed for ICs in advanced CMOS processes do not normally have the capability of carrying amps of current. In addition, the thin gate oxides of the order of 50 angstroms mean that high voltages cannot be sustained in these technologies. Under ESD stress conditions, the MOS transistor behavior changes drastically from normal operation. The actual conduction mechanism is that of a bipolar action in the parasitic lateral bipolar transistor.

Every MOS transistor necessarily also includes a low-gain bipolar transistor structure. (For example, an NMOS transistor necessarily includes an NPN transistor, defined by the N+ source diffusion, the P-type channel, and the N+ drain diffusion.) The bipolar transistor is not necessary for normal operation of the MOS transistor, and hence is referred to as a "parasitic" device. In normal operation of a MOS transistor there is very little substrate current, and hence there is no significant base current applied to the bipolar transistor. However, when MOS transistors are used for ESD protection, the bipolar transistor's operation may be very important.

Figure 5:
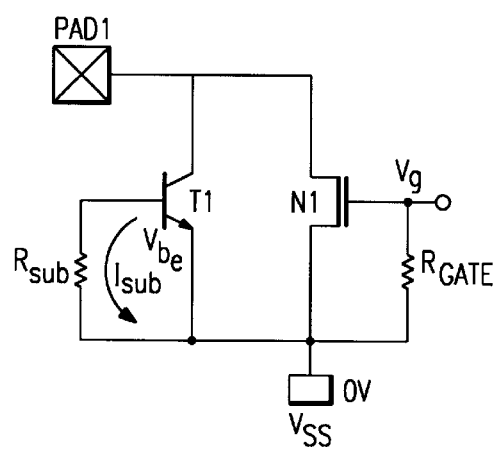
FIG. 5 shows a schematic diagram of a typical ESD protection circuit with a parasitic NPN transistor between the pad and $V_{SS}$.

FIG. 5 is a more detailed schematic diagram of the ESD protection circuit of FIG. 2, showing the parasitic NPN transistor T0 in parallel with the MOS transistor N0. The emitter of the NPN transistor T0 is connected to the source of the MOS transistor N0, and the collector of T0 is connected to the drain of N0. The gate of transistor N0 is tied to $V_{SS}$ (the most negative voltage, or ground) through a resistance Rgate, so that the gate voltage $V_G$ is essentially zero volts. (Resistance $R_{GATE}$ is the effective resistance from the gate to the more negative voltage supply, $V_{SS}$.) Under ESD conditions, typical protection requires that an NPN transistor T0 between the pad PAD1 and $V_{SS}$ be turned on during the stress event. When the emitter-base voltage, $V_{be}$, is sufficiently high that the emitter current can substantially contribute to the avalanche process at the collector-base junction, the transistor T0 goes into a low impedance mode shunting the ESD current. The effective substrate resistance, denoted by $R_{sub}$, acts to put the transistor T0 in self-biasing mode such that when the collector of T0 receives an ESD event at the pad PAD1, transistor T0 turns on with the rising collector voltage.

Figure 6:
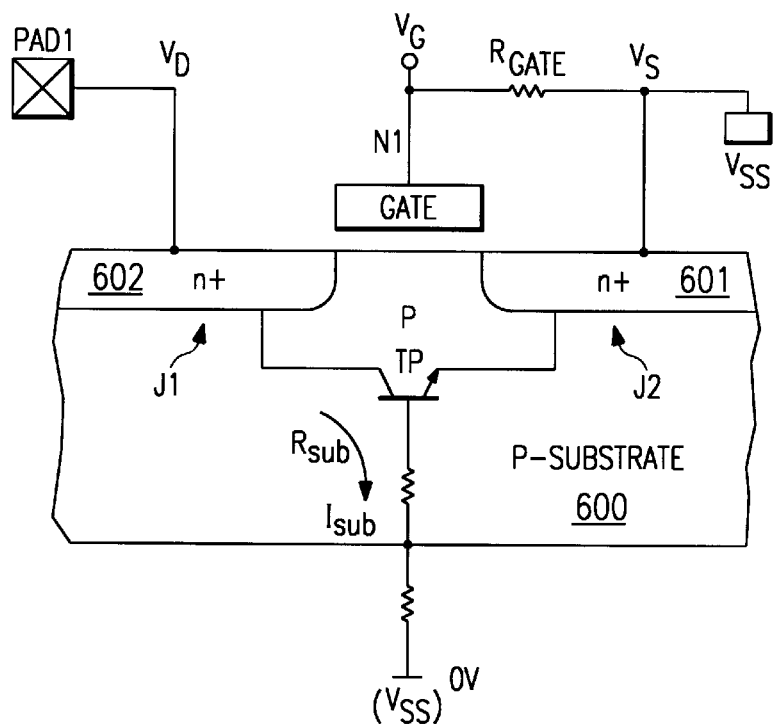
FIG. 6 shows a cross-section and schematic circuit of the NMOS and parasitic NPN transistors of FIG. 5.

FIG. 6 schematically shows a cross-section of the device structure of the NMOS transistor N0 and parasitic lateral NPN transistor T0 of FIG. 5. N+ diffusion 601 is both the source of N0 and the emitter of T0. N+ diffusion 602 is both the drain of N0 and the collector of T0. Junction J1 is the base-collector junction of T0, and junction J2 is the base-emitter junction of T0. The base of T0 is connected to ground through the substrate 600. (However, this connection has a significant parasitic resistance.) Upon the application of significant positive voltage at the pad PAD1, with the gate voltage $V_G$, source voltage $V_S$, and substrate voltage $V_{SS}$ all at zero volts, no current will flow until the reverse-biased drain-substrate junction goes into avalanche breakdown.

Figure 7:
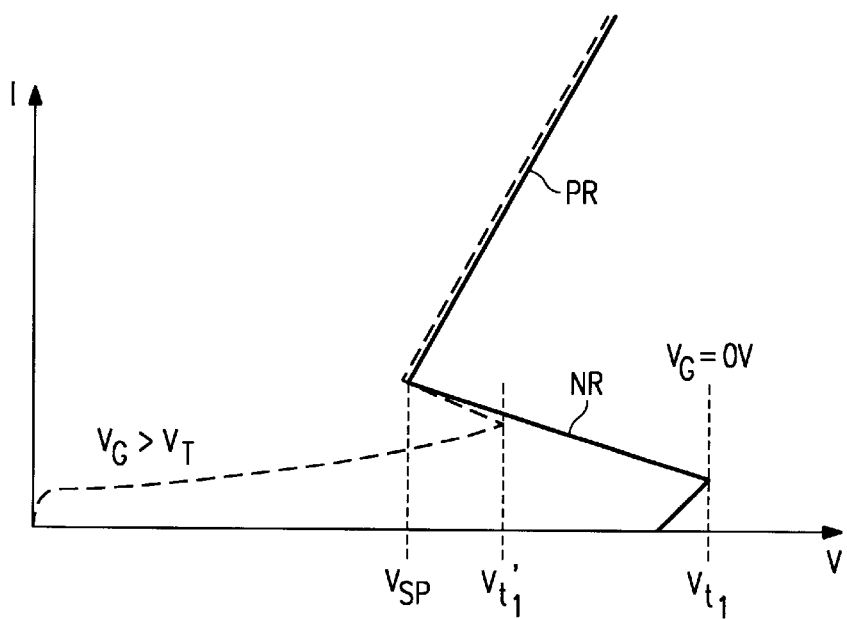
FIG. 7 shows an I–V curve of an nMOS transistor with voltage applied at the drain, and with the gate, source, and substrate at zero volts.

During an ESD (high current) event, as shown in the solid curve of FIG. 7, the NPN transistor T0 will turn on only when the applied voltage reaches a level Vt1 which is high enough to cause avalanching at the drain-substrate junction J1. The current injection from avalanching induces bipolar conduction, and a negative resistance region NR is observed due to the availability of more carriers for multiplication. Thus the voltage across the device decreases, while current increases, until a minimum voltage $V_{sp}$ (the snapback holding voltage) is reached. The I–V curve now shows a positive resistance PR as further increase in the injected current results in conductivity modulation of the substrate (base) region which reduces the intrinsic substrate resistance. In this process, it is desirable to reduce the peak voltage Vt1, to ensure that avalanching can occur before the MOS devices in the protection circuit are destroyed.

Cascoded-MOS Protection

Figure 3:
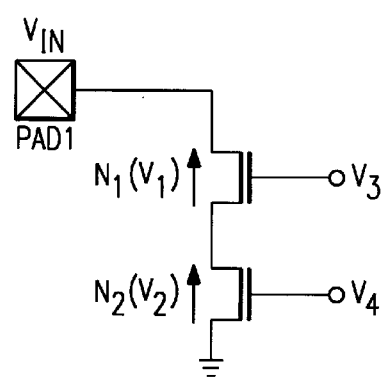
FIG. 3 shows a cascoded gate oxide protection circuit connected to a pad.

FIG. 3 shows an innovative cascoded MOS protection circuit. The cascoded connection of the MOS devices provides greater robustness, while the appropriate control of bias voltages V3 and V4 reduces stress on the gate oxides during normal operation. If $V_3$ is at the lower power supply voltage (e.g. 2.5 V in a 2.5 V/3.3 V process) and $V_4$ is at ground, then the voltage across the gate of N1 is $V_3-V_T$ (where $V_T$ is the threshold voltage at which the transistor turns on), and across the gate of $V_4$, is approximately equal to $V_2$, if $V_4$ is at ground. Therefore, the potentials for $V_3$ and $V_4$ are important in defining the applicability of this approach and are usually defined by driver circuitry.

Figure 8:
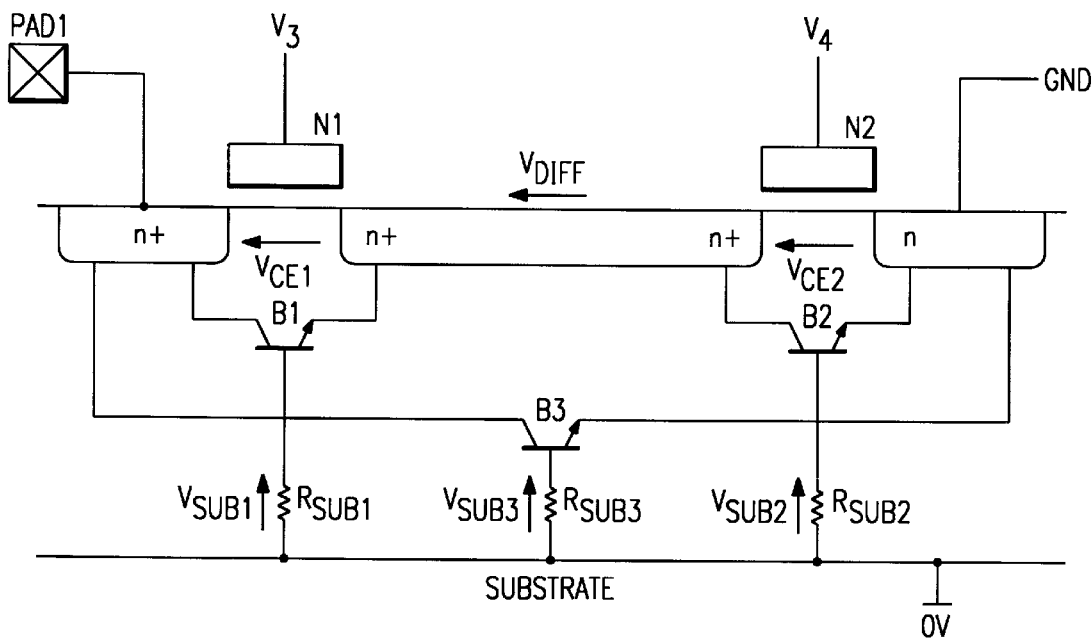
FIG. 8 shows a cross-section and schematic circuit of two nMOS transistors and associated substrate lateral NPN transistors.

FIG. 8 shows a cross-section and schematic circuit of the two nMOS transistors of FIG. 3, and associated substrate lateral NPN transistors. B1 and B2 are the NPN transistors associated with N1 and N2 respectively. B3 is the NPN transistor of the combined structure.

The device operation requires that the voltage VSUB2 across RSUB2 be at least 0.7 volts, which implies the voltage VSUB1 across RSUB1 must be greateer than 0.7 V. (VSUB1 will be approximately equal to $V_{SUB2}+V_{CE2}+V_{DIFF}$.) However, the junction voltage $V_{be1}$ will be lower than $V_{be2}$, since $R_{SUB1}$ is approximately equal to $R_{SUB2}$. For a given injection current $I_{in}$, the voltage $V_{CE2}$ across B2 is less than the voltage across B1, $V_{CE1}$, ($V_{CE2}<V_{CE1}$) as shown. The value of $V_{DIFF}$ will also play a role in the biasing of the transistors. Since we would like to raise the $I_{in}$ capability, this would require a smaller $V_{DIFF}$. Other design rules for $R_{SUBS}$ and the gate length can also be identified. The gate length of N2 is defined by the off current requirements of the design.

Figure 1:
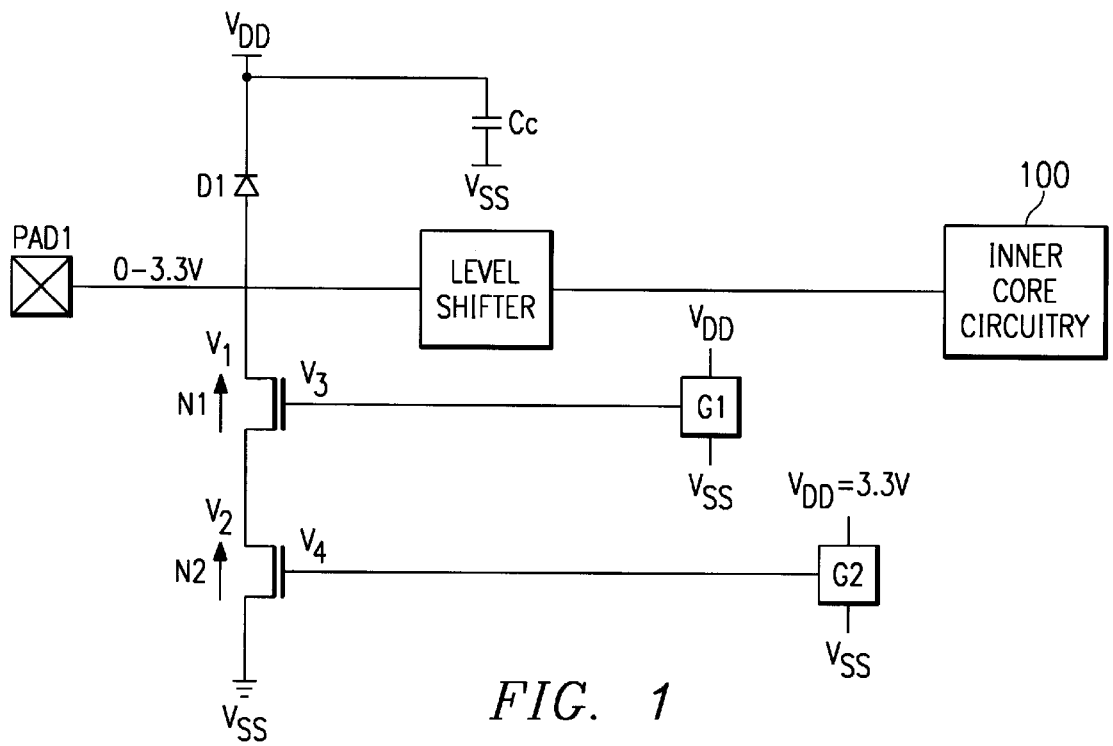
FIG. 1 shows a detailed embodiment of the cascoded nMOS protection circuit.

FIG. 1 shows a complete cascoded-MOS protection circuit connected to a pad and the associated cascode circuits. This invention pertains to the bias circuits which define $V_3$ and $V_4$ in a cascoded nMOS ESD protection, such that the circuit is in high impedance (off) during normal operation, and low impedance (on) during an ESD event.

G1 and G2 are the driver circuits which define $V_3$ and $V_4$. D1 is a diode between pad PAD1 and $V_{DD}$, and $C_C$ is the chip capacitance between $V_{DD}$ and $V_{SS}$. In a sample embodiment, where the inner core circuitry 100 is powered from a 2.5 V supply, VDD is a 3.3 V supply line which is used to power output drivers.

During normal operation (after the circuit has been socketed and placed in service), $V_3$ and/or $V_4$ are low, so that no significant current flows between pad PAD1 and $V_{SS}$. During an ESD event, suppose that a positive voltage appears on pad PAD1, with $V_{SS}$ grounded and $V_{DD}$ floating. (This is a worst-case condition, since if $V_{DD}$ is grounded diode D1 will provide a low-impedance path to clamp the voltage on the pad.) $V_3$ and $V_4$ are high and both MOS devices are conducting MOS current when the lateral NPNs turn on. The diode D1 conducts current to charge $C_C$ in turn raising $V_{DD}$. This enables the circuitry in G1 and G2 to turn on and raise $V_3$ and $V_4$ to levels greater than in nMOS threshold voltage.

Figure 4:
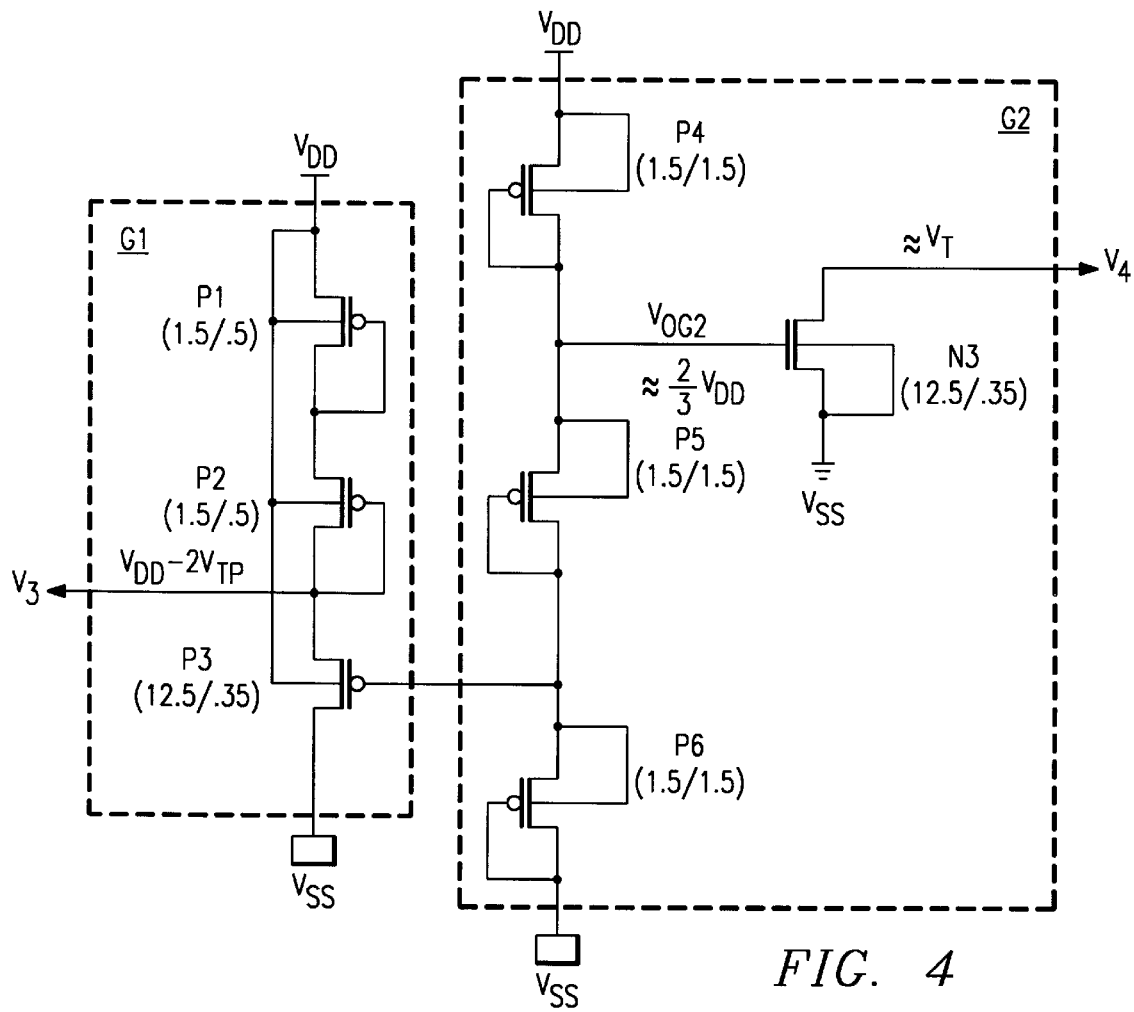
FIG. 4 shows a biasing circuit implementation, which generates bias voltages V3 and V4.

FIG. 4 shows a detailed embodiment of bias circuits G1 and G2 for the protection circuit of FIG. 1. The bias circuit is represented by pMOS transistors P1, P2, and P3 for G1; P4, P5, and P6 and N3 for G2.

Diode D1 will ensure that VDD is no more than one diode drop below the pad voltage. As VDD comes up, V3 will track VDD: VDD will approximately equal VDD–2VTP. Once VDD exceeds 3VT, the combination of P1–P3 will act as a voltage divider, and V3 will go to approximately one third of V3. Similarly, VOG2 will initially equal VDD–VTP. Once VDD exceeds 2VT, N3 will therefore turn on, and keep V4 at approximately one VT. This keeps N2 in a high impedance state. Hence, N1 is normally on when the pad is high, and N2 is normally off. The voltages across the gate oxides connected to the signal pad, for a pad voltage of 3.3 V are as follows: for N1, $V_{IN}-V_3$ is approximately equal to $V_T$ (0.6 V); for N2, $V_{IN}-V_1-V_4$ is approximately equal to $3.3-2V_T=1.5$ V. Hence gate oxide reliability specs are achieved.

During ESD, $V_{DD}$ is initially floating for the worst case stress condition of pad positive with respect to ground, and the voltage at $V_{DD}$ will be nearly zero volts. Hence the transistor N1 will initially be off, and N2 will be on. During the ESD pulse the high impedance of N1 will result in large dV/dt (e.g. approximately equal to 40 V/ns). This will result in raising the gate voltage of N1 and turning it on. The on currents of both N1 and N2 will increase the substrate currents generated by their transistors and help to trigger the bipolar transistors associated with N1, N2, and the combination of N1 and N2.

FIG. 7 shows an I–V curve of an nMOS transistor with voltage applied at the drain, and with the gate, source, and substrate at zero volts. As the dashed line shows, if gate voltage $V_G$ is greater than the threshold voltage $V_T$, then the MOS drain current reduces the turn-on voltage of the parasitic bipolar transistor to $V_{t1}'$. This means that the protection circuit is activated more easily, and enhances the capability to protect the thin gate oxides and shallow junctions in the input and output circuits. The lower turn-on voltage is extremely desirable in ESD protection circuits, because it ensures that the protection device will trigger before the device being protected.

Figure 9:
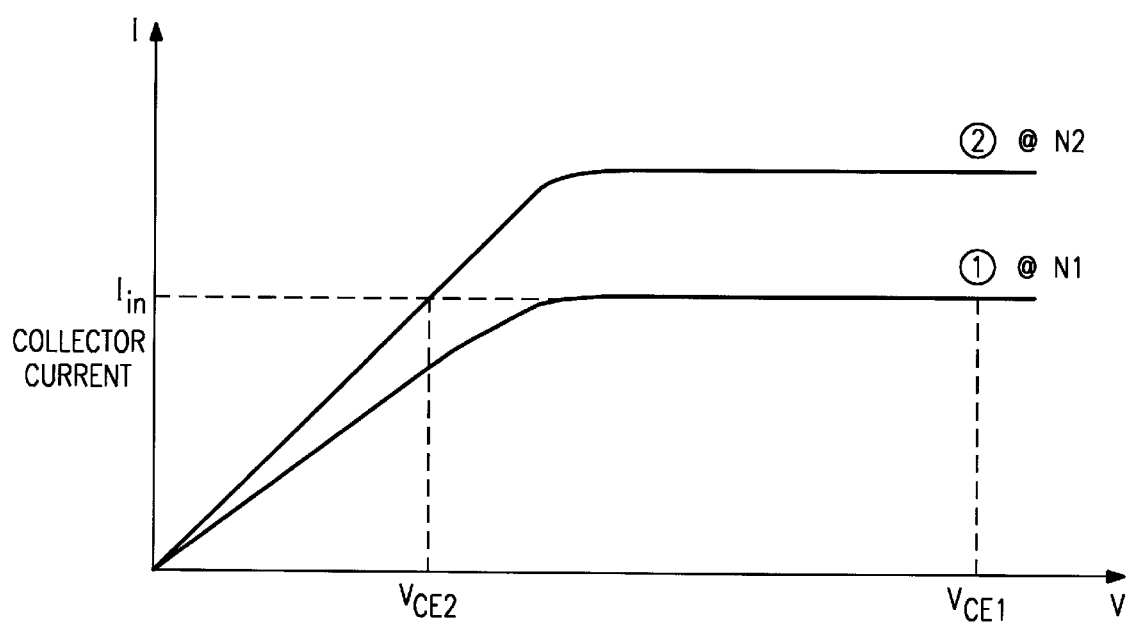
FIG. 9 shows an I–V curve of the substrate transistor collector-emitter voltages.

FIG. 9 shows an I–V curve of the substrate transistor collector-emitter voltages. For a given injection current, $I_{in}$, the voltage across B2, $V_{CE2}$, is less than the voltage across B1, $V_{CE1}$, ($V_{CE2}<V_{CE1}$) as shown.

Figure 10:
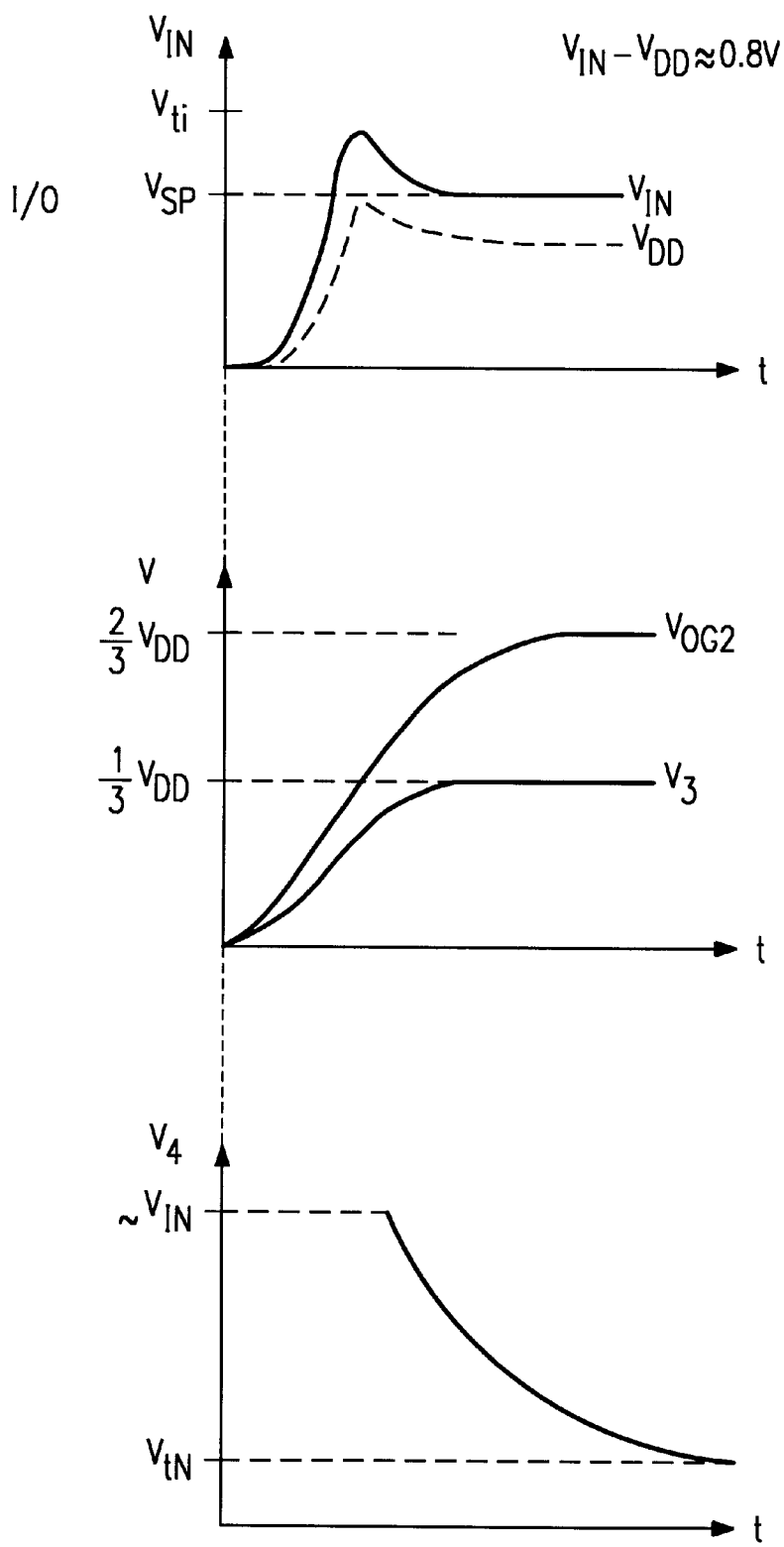
FIG. 10 shows voltage waveforms when an ESD hit occurs.

FIG. 10 shows voltage waveforms when an ESD hit occurs.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, other bias circuits can be used to achieve the desired operating voltages.

It should also be noted that the number of layers of metallization described above does not implicitly limit any of the claims, which can be applied to processes and structures with more or fewer layers.

Similarly, it will be readily recognized that the described process steps can also be embedded into hybrid process flows, such as BiCMOS or smart-power processes.

What is claimed is:

1. An integrated circuit structure, comprising:
    a plurality of contact pads including a first contact pad for receiving a voltage; wherein said first contact pad is functionally connected between a more positive power supply line and a more negative power supply line, and to an inner core circuitry;
    an overvoltage protection circuit operatively connected between said first contact pad and said more negative power supply line;
    wherein said overvoltage protection circuit comprises first and second nMOS devices connected in series between said first contact pad and said more negative power supply line;
    a first biasing circuit operatively connected to a control terminal of said first nMOS device; and
    a second biasing circuit operatively connected to a control terminal of said second nMOS device;
    wherein said first and second biasing circuits are connected between said more positive power supply line and said more negative power supply line, and
    wherein said first and second nMOS devices include respective gate dielectrics, neither of which alone will reliably withstand the voltages normally present on said first contact pad.

2. The integrated circuit structure of claim 1, further comprising:
    a rectifying element interposed between said first contact pad and said more positive power supply line, and connected to conduct current in a first direction.

3. The integrated circuit structure of claim 1, further comprising:
    a capacitor operatively connected between said more positive power supply line and said more negative power supply line.

4. An integrated circuit biasing structure, comprising:
    first and second biasing circuits operatively connected to first and second output connections, respectively, and interconnected to each other by an interconnection line;
    wherein said first biasing circuit comprises
        a plurality of cascoded pMOS devices including a first pMOS device, interposed between a more positive power supply line and a more negative power supply line; and
    wherein said second biasing circuit comprises
        a plurality of cascoded pMOS devices comprising second and third pMOS devices, interposed between said more positive power supply line and said more negative power supply line; and
        an nMOS device; wherein a control terminal of said nMOS device is operatively connected to an output terminal of said second pMOS device, an input terminal of said nMOS device is operatively connected to said second output connection, and said output terminal of said nMOS device is connected to said more negative power supply line;
    wherein said interconnection line connects a control terminal of said first pMOS device to an input terminal of said third pMOS device, and said first output connection operatively connects to an input terminal of said first pMOS device.

5. A method for protecting integrated circuitry against ESD, comprising the steps of:
    (a.) receiving a first voltage at a first contact pad;
    (b.) providing first and second nMOS devices in a cascode configuration between said first contact pad and a more negative power supply line;
    (c.) providing a rectifying element between said first pad and a more positive power supply line;
    (d.) biasing voltage at control terminals of said first and second nMOS devices with first and second biasing circuits, respectively, such that when said rectifying element conducts current to charge a capacitor, said first and second biasing circuits turn on and raise said voltage at said control terminals greater than said nMOS devices threshold voltage.

* * * * *